(12) United States Patent
Gazit

(10) Patent No.: US 7,009,458 B2
(45) Date of Patent: Mar. 7, 2006

(54) METHOD AND SYSTEM FOR FAST WAKE-UP OF OSCILLATORS

(75) Inventor: Meir Gazit, Ahskelon (IL)

(73) Assignee: Vishay Advanced Technologies LTD, Or Yehuda (IL)

( * ) Notice: Subject to any disclaimer, the term of this patent is extended or adjusted under 35 U.S.C. 154(b) by 0 days.

(21) Appl. No.: 10/476,618

(22) PCT Filed: Oct. 19, 2003

(86) PCT No.: PCT/IL03/00846

§ 371 (c)(1),
(2), (4) Date: Mar. 5, 2004

(87) PCT Pub. No.: WO2004/036733

PCT Pub. Date: Apr. 29, 2004

(65) Prior Publication Data

US 2005/0083139 A1   Apr. 21, 2005

Related U.S. Application Data

(60) Provisional application No. 60/418,339, filed on Oct. 16, 2002.

(51) Int. Cl.
*H03B 5/30* (2006.01)

(52) U.S. Cl. ............................ 331/116 R; 331/116 FE; 331/158; 331/46; 331/47; 331/55

(58) Field of Classification Search ................ 331/158, 331/116 R, 116 FE, 46, 47, 55
See application file for complete search history.

(56) References Cited

U.S. PATENT DOCUMENTS

| 4,196,404 A | * | 4/1980 | Ebihara | ................ 331/116 FE |
| 5,805,027 A | | 9/1998 | Yin | ............................ 331/158 |
| 6,057,742 A | | 5/2000 | Prado | .................... 331/116 FE |
| 6,819,195 B1 | * | 11/2004 | Blanchard et al. | .......... 331/173 |

* cited by examiner

*Primary Examiner*—Arnold Kinkead
(74) *Attorney, Agent, or Firm*—Mark M. Friedman

(57) ABSTRACT

A method and system for fast wakeup of a high-Q oscillator (300) that includes a resonating element (304), preferably a crystal resonator (304), and an amplifier (310). The method comprises connecting the resonating element (304) to a fast wakeup, low-Q oscillator (302), inputting a plurality of pulses generated by the low-Q oscillator (302) into the resonating element (304), and simultaneously disconnecting the resonating element (304) from the low-Q oscillator (302) while connecting the resonating element (304) to the amplifier (310), thereby obtaining substantially uniform steady state oscillations in the high-Q oscillator. The system (300) includes in addition to high-Q and low-Q oscillator elements a mechanism for counting the pulses (312) and for performing the simultaneous disconnection and connection mentioned above.

19 Claims, 5 Drawing Sheets

METHOD AND SYSTEM FOR FAST WAKE-UP OF OSCILLATORS

CROSS-REFERENCE TO RELATED APPLICATIONS

This application is entitled to the benefit of priority from U.S. Provisional Application No. 60/418,339 filed Oct. 16, 2002.

FIELD OF THE INVENTION

The present invention relates generally to crystal oscillators, and more particularly, to oscillators with fast start times.

BACKGROUND OF THE INVENTION

Many consumer products in use today have embedded RF wireless communication elements. Wireless consumer products ideally require low power consumption and low cost. One strategy for low power consumption (i.e. power conservation) in low data rate applications is to use a device that normally includes at least one oscillator in a mode of bursts of very high rate data streams, separated by "sleep" modes during which the device consumes very little current. However, this strategy has a problem in that the wake-up time of the device's oscillator could be quite long, i.e. several microseconds. This makes such a strategy unattractive.

Typically, an oscillator includes a quartz crystal as a resonance element. Quartz crystals are well known in the art. A quartz crystal is characterized by a very precise resonance frequency or "accuracy", and a very high quality factor marked as "Q". The quality factor is the ratio between the energy installed in the crystal and the energy wasted in every cycle of oscillation. In order for the oscillator to "wake-up" at the start of an oscillation cycle, one needs to take a signal introduced on the resonator feeds, amplify it and feed it back into the resonator. The initial signal on the resonator feeds is white noise, which has the bandwidth of the resonator and the amplitude of the equivalent resistance of the resonator. Because this signal is very small, one needs to wait a long time for the energy in the resonator to build lip.

Circuits and methods for fast wake-up or "kick-starting" an oscillator are also known. In particular, there are known methods and circuits that use energy other than white noise to kick-start an oscillator. For example, U.S. Pat. No. 5,805,027 to Yin (hereafter "Yin") teaches a transistor circuit for fast start up of a crystal oscillator. A voltage pulse from a pulse generator 30 is mirrored to the gain stage comprised of transistors T6, T7 and T8 to make a current pulse that causes the crystal to start oscillating. In another example, U.S. Pat. No. 6,057,742 to Prado (hereafter "Prado") teaches a crystal oscillator in which a noise generator 16 applies the voltage waveform illustrated as a curve 50 in his FIG. 4 to an input 12A of an oscillator circuit 12. However, both Yin's and Prado's use of a single "kick" pulse has a major disadvantage: it provides a wake-up time that is still far too long in comparison with the times achievable with the method and system of the present invention, i.e. wastes energy. By providing a single interrogating pulse to the crystal resonator, one does not fully utilize the potential of awakening the crystal oscillator in a fast and efficient manner.

There is therefore a widely recognized need for, and it would be highly advantageous to have a fast wake-up oscillator that does not suffer for the disadvantages listed above.

SUMMARY OF THE INVENTION

The present invention provides a method and system that uses multiple pulses to fast wakeup an oscillator but avoids the cancellation oscillations of FIG. 2. In the present invention, we can amplify and resonate an interrogating effect by applying a series of pulses, which are well timed to build an oscillating effect, therefore achieving a wake-up time far shorter than the one achieved by single "kick" pulses as in Yin and Prado above.

According to the present invention there is provided a method for reducing the start-up time of a high-Q oscillator comprising the steps of: providing a low-Q fast wake-up oscillator; providing a high-Q resonator connectable through two, first and second switches to two connecting configurations, the first of the connecting configurations connecting the high-Q resonator to the low-Q fast wake-up oscillator and to a voltage reference, and the second of the connecting configurations disconnecting the high-Q resonator from the low-Q fast wake-up oscillator; and operating the low-Q fast wake-up oscillator to generate steady state, substantially constant amplitude oscillations in the high-Q resonator when the high-Q resonator is connected in the second connecting configuration.

According to the present invention there is provided a fast wakeup high-Q oscillator system comprising a fast wakeup low-Q oscillator, a high-Q resonating element connectable to the low-Q oscillator and to an internal amplifier, and a wakeup mechanism operative to transfer pulses generated by the low-Q oscillator to the high-Q resonating element, the pulses used to fast wakeup a high-Q oscillator the includes the high-Q resonating element and the internal amplifier.

According to the present invention there is provided a system for fast waking up a high-Q oscillator having a resonating element connected to an internal amplifier, the system comprising: a low-Q oscillator connectable to the resonating element and operative to input a plurality of pulses to the resonating element when the resonating element is disconnected from the internal amplifier, the pulses building up the energy of the resonating element; and means to simultaneously disconnect the resonating element from the low-Q oscillator and to reconnect the resonating element to the internal amplifier, whereby the high-Q oscillator is speedily woken up by the built up energy.

According to the present invention there is provided a method for fast wakeup of a high-Q oscillator that includes a resonating element and an amplifier, the method comprising the steps of connecting the resonating element to a fast wakeup, low-Q oscillator; inputting a plurality of pulses generated by the low-Q oscillator into the resonating element, thereby building up a resonating element energy; and simultaneously disconnecting the resonating element from the low-Q oscillator while connecting the resonating element to the amplifier, thereby obtaining substantially uniform steady state oscillations in the high-Q oscillator.

Because the wakeup of the high-Q oscillator in the present invention is based on a train of pulses of equal frequency and amplitude generated by the low-Q oscillator and not on white noise, the wakeup is much more efficient and much faster than in prior art systems. Thus, the system and method of the present invention advantageously save energy in the many cases where a high-Q oscillator is active for only a very small portion of a duty cycle, because much less energy is wasted on the wakeup itself relative to the other active functions of the high-Q oscillator.

BRIEF DESCRIPTION OF THE DRAWINGS

The invention is herein described, by way of example only, with reference to the accompanying drawings, wherein.

DESCRIPTION OF THE PREFERRED EMBODIMENTS

The system and method of the present invention provide a finite, optimal number ("train") of pulses for optimal wakeup time. The optimal number of pulses is mostly defined by the accuracy of the fast wakeup RC oscillator used to interrogate the crystal. The more accurate it is, the higher the number of pluses one can feed to the crystal without destroying the energy already accumulated.

Figure 1:
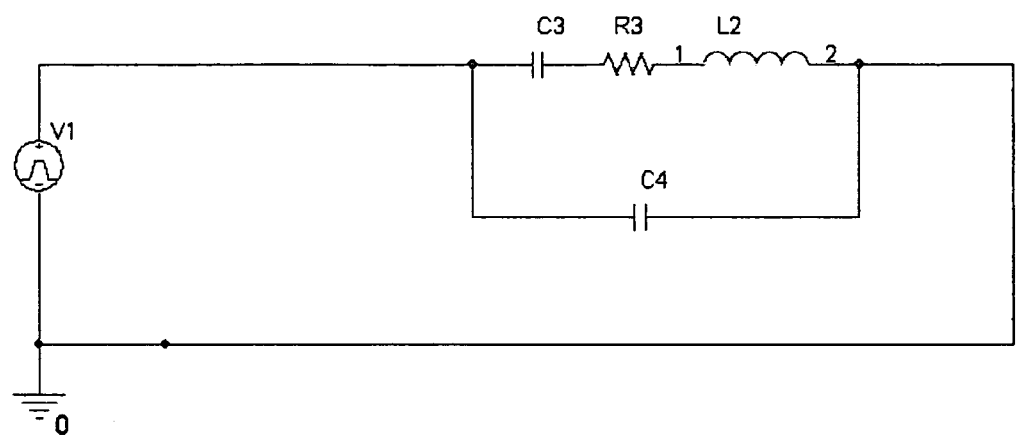
FIG. 1 shows a basic circuit for multiple pulse wake-up of an oscillator.
Figure 2:
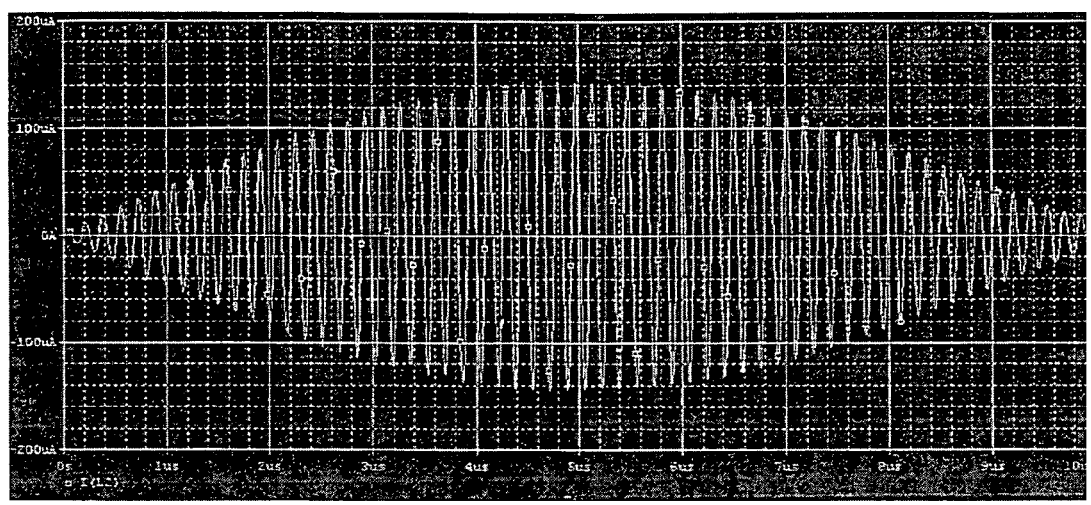
FIG. 2 shows the oscillations caused by the circuit of FIG. 1.

As mentioned above, fast wake-up oscillators have been implemented that use a single pulse from a source to "kick-start" the oscillations. There are no known methods or circuits that use intentionally introduce multiple pulses (not "white noise") that aim to achieve the same effect. Thus, the intentional use of multiple, substantially equal pulses to fast wakeup a high-Q oscillator, as disclosed herein, is by itself innovative. However, a simplistic use of multiple pulses may not lead to the required result. Specifically, if the frequency of a train of pulses is offset from the resonating crystal frequency, the pulses will build an oscillating energy, then destroy it as they accumulate a phase in a way that ends up being antipodal (i.e. a 180 degrees shift—on the opposite sides of the phase circle) to the actual crystal oscillation. For example, FIG. 1 is a schematic description of a tentative multi-pulse circuit that can be used to "wake-up" an oscillator. An R3-L2-C3 component stands in as an electrical model of a resonator element, e.g. a crystal resonator. A voltage source V1 is a multi-pulse source that can provide a series of pulses, leading to oscillations across inductor L2 between points 1 and 2. C4 represents an unavoidable parasitic capacitance. If the number of pulses is unlimited, the oscillation eventually "dies out" or is "self-cancelled" as shown in FIG. 2, the self-cancellation resulting from frequency shifts that exist between the source (pulse generator frequency) and the crystal (crystal resonance frequency). In other words, FIG. 2 shows that if the circuit in FIG. 1 is fed too many pulses, the energy is diminished instead of being built up. Thus, an optimal finite number of pulses must be provided in order to fast wakeup the high-Q oscillator in the shortest time possible, while not "killing" the oscillations.

Figure 3:
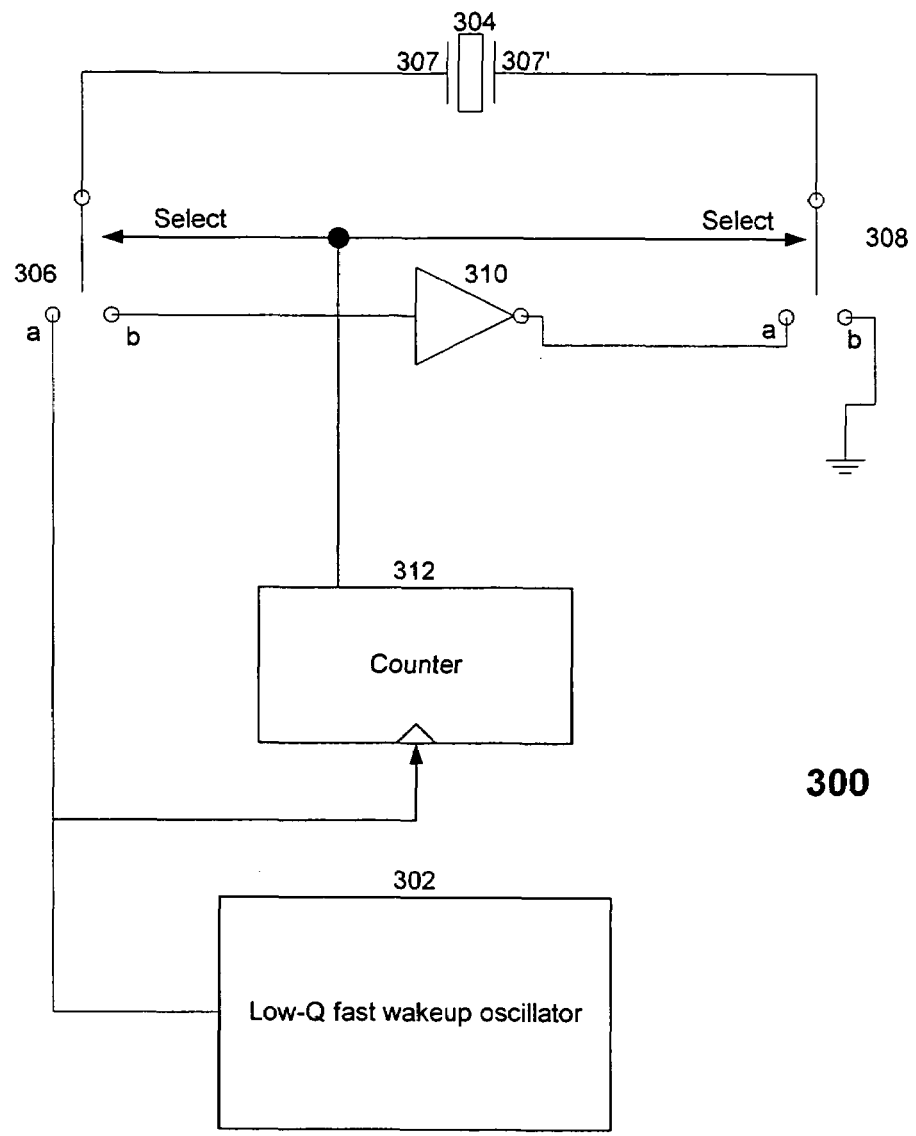
FIG. 3 shows a preferred embodiment of a system for providing fast wake-up for oscillators according to the present invention.
Figure 5:
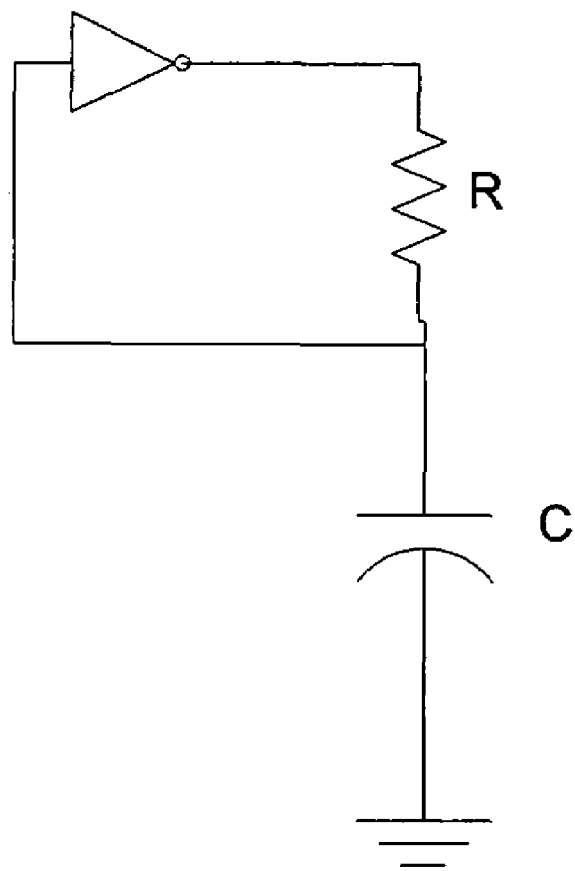
FIG. 5 shows a simple embodiment of a low-Q oscillator.

FIG. 3 shows schematically a preferred embodiment of a system 300 for providing fast wake-up for oscillators according to the present invention. System 300 comprises a low-Q fast wake-up oscillator 302 that may be connected in one connecting configuration (see below) to a high-Q resonating element, preferably a crystal resonator (also referred to herein simply as "crystal" or "resonator") 304 via a first selecting switch 306 and a first feed 307. In this description, "high-Q" refers to a typical range of 10,000–100,000, and "low-Q" refers to a typical range of 1–5. Low-Q oscillator 302 may comprise for example an RC-circuit and a Schmidt-trigger feedback element (shown in FIG. 5), or other configurations that are well known. Crystal 304 may be connected to a reference voltage such as ground via a second feed 307' and a second selecting switch 308. Switches 306 and 308 may each be in two switching configurations or positions "a" and "b" (marked by contacts a and b) and are connectable to each other through an internal amplifier 310. System 300 further comprises an internal amplifier 310 connectable to crystal resonator 304. For example, in position "a" of switch 306, switch 306 connects low-Q oscillator 302 to crystal resonator 304, with amplifier 310 being disconnected from crystal resonator 304. In position "b" of switch 308, switch 308 connects crystal resonator 304 to the voltage reference, which is chosen for convenience to be zero (ground) but may as mentioned have a different value, with amplifier 310 still disconnected from crystal resonator 304. The configuration provided by switch 306 being in the "a" position and switch 308 being in the "b" position, and including oscillator 302, switch 306, resonator 304, switch 308 and the voltage reference (ground) is referred to as a first connecting configuration. Conversely, with switch 306 in position "b", and switch 308 in position "a", resonator 304 is connected in a closed loop with amplifier 310, and disconnected from both low-Q oscillator 302 and ground. This configuration, which includes in a close loop the two switches, resonator 304 and amplifier 310 is referred to as a second connecting configuration. The second connecting configuration is in essence a high-Q oscillator, which is being woken up by the series of pulses provided by the low-Q oscillator. A counter 312 is connected to low Q oscillator 302 and to both switches 306 and 308, is operative to activate the two switches simultaneously, and provides a count of the pulses originating from low-Q oscillator 308. The counter is set to count the number of pulses until it reaches a pre-defined limit (i.e. a pre-set number of pulses). This may be achieved for example by a simple digital comparator that gives rise to a digital signal once the counter reaches a pre-defined number that is fed to this comparator as reference. Thus, switches 306 and 308 and counter 312 comprise a "wakeup" mechanism for the high-Q oscillator. In other words, the wakeup mechanism includes two switches operative to cooperatively switch the resonator from the first to the second connecting configuration, the counter configured to generate the output signal that effects the switching. The implementation of system 300 using either discrete components in a semi-hybrid or hybrid circuit, or as an integrated circuit should be apparent to anyone skilled in the art.

Upon applying a common voltage (e.g. relative to ground as shown) to all the active parts of system 300 (i.e. the low Q oscillator, the amplifier of the high-Q oscillator, the counter and the switches), low-Q fast wakeup oscillator 302 starts oscillating immediately. For example the RC Schmidt-trigger based oscillator shown in FIG. 5 and having Q=1 always wakes up within one pulse, i.e. it takes only one cycle for such an oscillator to be fully operational.

Upon wakeup of the low-Q oscillator, switch 306 is set to feed crystal 304 from fast wakeup low-Q oscillator 302 (position a), while switch 308 is set to short to crystal 304 to ground (position b). The switch setting is done through a signal marked "Select", output by counter 312. As a result of this setting of the switches, oscillator 302 is feeding electrical pulses directly to one feed 307 of the crystal, while the other feed 307' of the crystal is directly connected to the ground. As a result, with every electrical pulse being applied, the crystal self-resonance frequency starts building up energy inside the crystal.

Further upon wakeup of the low-Q oscillator, counter 312 starts counting the pulses generated by the low-Q fast wakeup oscillator. As mentioned, the counter is set to count the number of pulses until it reaches a pre-defined limit (i.e. a pre-set number of pulses). When the counter reaches its limit, its output control signal ('Select') is logically inverted. That is, switch 306 is set to position b while switch 308 is set to position a. As a result of the inversion, the switches re-rout (connect) the crystal from this time on to internal amplifier 310. From the time of the rerouting, internal amplifier 310 together with crystal resonator 304 start building up the high-Q oscillation, based on the crystal resonance frequency. Since the crystal is already charged with some resonance energy, as fed to it by the sequence of pulses generated by the low-Q fast wakeup oscillator, the wakeup process of the high-Q oscillator is much faster. The high-Q oscillations thus reach a steady state in which they have substantially constant amplitude, in a time period equal to the time it takes to produce the pre-set number of pulses. In other words, the frequency and number of the pre-set pulses determines the start-up time. For example, given the same crystal and the same amplifier as Yin's, the wakeup time of the present invention can be 10–100 times faster than the one achieved by Yin. With the system and method of the present invention, one can easily insert 10–100 times more energy into the crystal resonator, by applying 10–100 pulses (the number depending on the accuracy of the low-Q oscillator, as mentioned above,) compared to Yin's method that uses only one pulse. Every pulse provides the same amount of energy for the oscillation build-up process.

Since each particular crystal has a given resonance frequency, the optimization of the number of pulses for waking up the particular high-Q oscillator based on it depends on various parameters that affect the frequency of the low-Q oscillator, as well as the parameters of the other circuit elements. The minimum number of pulses in the system and method of the present invention is two. The optimal number is the largest number that still does not cause the "self cancellation" shown in FIG. 2. The optimal number depends on the accuracy of the low-Q oscillator. Typically, a trial-and-error simulation is run on a program such as PSPICE, in which the number of pulses is changed until the optimum number is reached.

Figure 4:
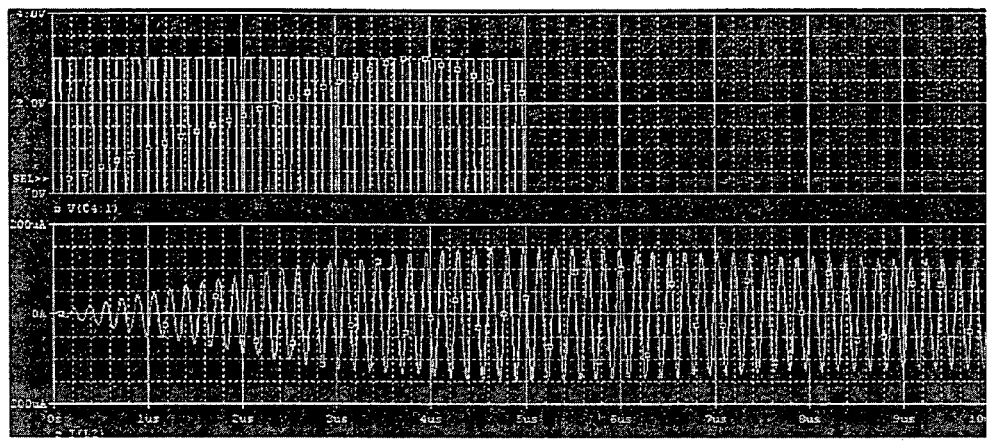
FIG. 4 shows experimental data on oscillations for a 30-pulse train in the system of FIG. 3.

FIG. 4 shows an exemplary oscillation pattern resulting from the use of the system of FIG. 3. In this exemplary case, 30 pulses were applied to the crystal (upper graph) in the first connecting configuration before inverting the Select output signal. After 30 pulses, the crystal was connected to the internal amplifier in the second connecting configuration. The lower graph shows that the amplitude of the oscillations in the second connecting configuration remained substantially constant, and was only slightly lower than the one before the pulses were terminated. This contrasts with the picture in FIG. 2, in which the oscillations die-out after a non-optimal, too large number of pulses. The time scale on the figure indicates a wakeup time of 5 $\mu$sec, i.e. orders of magnitude lower than that of Yin's oscillator, which by itself was much faster than that of prior art oscillator A main advantage of the system and method of the present invention it that is can deliver into the crystal resonator energy in a very efficient manner. When we use a train of pulses of given amplitude at a given frequency to "kick start" the high-Q oscillator, the oscillator circuit is provided with a power level much higher than the white noise power used to start an oscillator in conventional circuits, or the single pulse power provided by methods such as Yin's.

All publications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention.

While the invention has been described with respect to a limited number of embodiments, it will be appreciated that many variations, modifications and other applications of the invention may be made. Those skilled in the art will appreciate that the invention can be embodied by other forms and ways, without losing the scope of the invention. The embodiments described herein should be considered as illustrative and not restrictive.

What is claimed is:

1. A method for reducing the start-up time of a high-Q oscillator comprising the steps of:
   a. providing a low-Q fast wake-up oscillator;
   b. providing a high-Q resonator connectable through two, first and second switches to two connecting configurations, a first of said connecting configurations connecting said high-Q resonator to said low-Q fast wake-up oscillator and to a voltage reference, and a second of said connecting configurations disconnecting said high-Q resonator from said low-Q fast wake-up oscillator; and
   c. operating said low-Q fast wake-up oscillator to generate steady state, substantially constant amplitude oscillations in said high-Q resonator when said high-Q resonator is connected in said second connecting configuration.

2. The method of claim 1, wherein said step of operating includes waking up said low-Q oscillator, thereby providing a preset plurality of substantially equal amplitude pulses to said high-Q crystal resonator when said high-Q crystal resonator is connected in said first connecting configuration.

3. The method of claim 2, wherein said second connecting configuration includes an internal amplifier connected between said first and second switches, and wherein said step of operating further includes simultaneously switching said switches from a first switching configuration to a second switching configuration in which said internal amplifier closes a loop with said high-Q resonator.

4. The method of claim 3, wherein said simultaneous switching is effected by a counter connected to said low-Q oscillator and to said first and second switches.

5. The method of claim 4, wherein said providing a preset plurality of pulses includes presetting a number of pulses in said plurality in said counter, and generating an output signal from said counter to said switches when said preset number is reached.

6. The method of claim 2, wherein said present plurality of pulses is equal to an optimal plurality defined by a start of an oscillation self cancellation in the high-Q oscillator.

7. A fast wakeup high-Q oscillator circuit comprising:
   a. a fast wakeup low-Q oscillator;
   b. a high-Q resonating element connectable to said low-Q oscillator and to an internal amplifier; and
   c. a wakeup mechanism operative to transfer pulses generated by said low-Q oscillator to said high-Q resonating element, said pulses used to fast wakeup a high-Q oscillator that includes the high-Q resonating element and the internal amplifier.

8. The oscillator circuit of claim 7, wherein said resonating element is a crystal resonator.

9. The oscillator circuit of claim 7, wherein said wakeup mechanism includes two switches operative to cooperatively switch said resonating element from a first to a second connecting configuration, said second connecting configuration including an internal amplifier connected to said resonating element, said wakeup mechanism further including a counter configured to generate an output signal that effects said switching.

10. The oscillator circuit of claim 7, wherein the quality factor of said low-Q oscillator is between 1 and 5.

11. The oscillator circuit of claim 10, wherein the quality factor of said high-Q resonating element is between 10,000 and 100,000.

12. A system for fast waking up a high-Q oscillator having a resonating element connected to an internal amplifier, the system comprising:
   a. a low-Q oscillator connectable to the resonating element and operative to input a plurality of pulses to said resonating element when the resonating element is disconnected from the internal amplifier, said pulses building up the energy of the resonating element; and
   b. means to simultaneously disconnect the resonating element from said low-Q oscillator and to reconnect the resonating element to the internal amplifier, whereby said high-Q oscillator is speedily woken up by said built up energy.

13. The system of claim 12, wherein said resonating element is a crystal resonator.

14. The system of claim 12, wherein the quality factor of said low-Q oscillator is between 1 and 5.

15. The system of claim 12, wherein the quality factor of said high-Q resonating element is between 10,000 and 100,000.

16. The system of claim 12, wherein said means include two switches.

17. A method for fast wakeup of a high-Q oscillator that includes a resonating element and an amplifier, the method comprising the steps of;
   a. connecting the resonating element to a fast wakeup, low-Q oscillator;
   b. inputting a plurality of pulses generated by said low-Q oscillator into the resonating element, thereby building up a resonating element energy; and
   c. simultaneously disconnecting the resonating element from said low-Q oscillator while connecting the resonating element to the amplifier, thereby obtaining substantially uniform steady state oscillations in the high-Q oscillator.

18. The method of claim 17, wherein said resonating element is a crystal resonator.

19. The method of claim 17, wherein said step of simultaneously disconnecting is effected by a signal output by a counter connected to said low-Q oscillator, said counter counting said plurality of pulses.

* * * * *